(12) United States Patent
Voisin

(10) Patent No.: US 7,785,526 B2
(45) Date of Patent: Aug. 31, 2010

(54) IMPRINT ALIGNMENT METHOD, SYSTEM, AND TEMPLATE

(75) Inventor: Ronald D. Voisin, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 1776 days.

(21) Appl. No.: 10/895,214

(22) Filed: Jul. 20, 2004

(65) Prior Publication Data

US 2006/0019183 A1    Jan. 26, 2006

(51) Int. Cl.
B29C 35/08 (2006.01)
B29C 43/02 (2006.01)
B29C 33/00 (2006.01)

(52) U.S. Cl. .............. 264/496; 264/319; 977/887; 356/401

(58) Field of Classification Search .............. 264/293, 264/DIG. 42, 494, 496; 430/22, 30; 356/399, 356/400, 401
See application file for complete search history.

(56) References Cited

U.S. PATENT DOCUMENTS

| | | | |
|---|---|---|---|
| 3,577,593 A | 5/1971 | Jackson |
| 3,677,178 A | 7/1972 | Gipe |
| 3,783,520 A | 1/1974 | King |
| 4,070,116 A | 1/1978 | Frosch et al. |
| 4,201,800 A | 5/1980 | Alcorn et al. |
| 4,202,681 A | 5/1980 | McMaster et al. |
| 4,256,829 A | 3/1981 | Daniel |
| 4,326,805 A | 4/1982 | Feldman et al. |
| 4,356,018 A | 10/1982 | McMaster |
| 4,444,801 A | 4/1984 | Hongo et al. |
| 4,487,623 A | 12/1984 | Claassen et al. |
| 4,512,848 A | 4/1985 | Deckman et al. |
| 4,600,309 A | 7/1986 | Fay |
| 4,707,611 A | 11/1987 | Southwell |
| 4,722,878 A | 2/1988 | Watakabe et al. |

(Continued)

FOREIGN PATENT DOCUMENTS

CN    1442757 A    9/2003

(Continued)

OTHER PUBLICATIONS

X.-M. Zhao, Y. Xia, G.M. Whitesides, Fabrication of Three-Dimensional Micro-Structures: Microtransfer Molding, Advanced Materials, vol. 8, No. 10 (1996), pp. 837-840.*

(Continued)

Primary Examiner—Matthew J. Daniels
(74) Attorney, Agent, or Firm—Laura C. Robinson

(57) ABSTRACT

An improved lithographic alignment method, system, and template. The method includes creating, within a lithographic subfield, subsequent-layer features which are intentionally offset from their respective previous-layer features, where the intentional offset may vary in magnitude and direction from one subfield to the next. The system includes an imprint lithographic machine and first and second lithography templates where the templates are adapted to enable the machine to form first and second features, respectively, and where a second feature is configured to be deliberately offset from a corresponding first feature. The template set includes at least two templates, one having features which are deliberately offset from corresponding features of another template. Also, a method of manufacturing such a template set.

3 Claims, 5 Drawing Sheets

U.S. PATENT DOCUMENTS

| | | |
|---|---|---|
| 4,724,222 A | 2/1988 | Feldman |
| 4,731,155 A | 3/1988 | Napoli et al. |
| 4,776,695 A | 10/1988 | van Pham et al. |
| 4,848,911 A | 7/1989 | Uchida et al. |
| 4,865,639 A | 9/1989 | Kudo |
| 4,877,437 A | 10/1989 | Nitschke |
| 4,887,283 A | 12/1989 | Hosno |
| 4,897,228 A | 1/1990 | Miwa et al. |
| 4,929,083 A | 5/1990 | Brunner |
| 4,959,252 A | 9/1990 | Bonnebat et al. |
| 4,964,145 A | 10/1990 | Maldonado |
| 5,016,691 A | 5/1991 | Bernier |
| 5,028,366 A | 7/1991 | Harakal et al. |
| 5,072,126 A | 12/1991 | Progler |
| 5,074,667 A | 12/1991 | Miyatake |
| 5,110,514 A | 5/1992 | Soane |
| 5,148,036 A | 9/1992 | Matsugu et al. |
| 5,148,037 A | 9/1992 | Suda et al. |
| 5,151,754 A | 9/1992 | Ishibashi et al. |
| 5,155,749 A | 10/1992 | DiMilia et al. |
| 5,160,402 A | 11/1992 | Cheng |
| 5,171,490 A | 12/1992 | Fudim |
| 5,179,863 A | 1/1993 | Uchida et al. |
| 5,204,739 A | 4/1993 | Domenicali |
| 5,206,983 A | 5/1993 | Guckel et al. |
| 5,218,193 A | 6/1993 | Miyatake |
| 5,235,400 A | 8/1993 | Terasawa et al. |
| 5,240,550 A | 8/1993 | Boehnke et al. |
| 5,259,926 A | 11/1993 | Kuwabara et al. |
| 5,270,222 A | 12/1993 | Moslehi |
| 5,280,437 A * | 1/1994 | Corliss ......................... 702/94 |
| 5,331,371 A | 7/1994 | Mori et al. |
| 5,331,407 A | 7/1994 | Doi et al. |
| 5,335,066 A | 8/1994 | Yamada et al. |
| 5,348,616 A | 9/1994 | Hartman et al. |
| 5,355,219 A | 10/1994 | Araki et al. |
| 5,362,940 A | 11/1994 | MacDonald et al. |
| 5,371,822 A | 12/1994 | Horwitz et al. |
| 5,386,119 A | 1/1995 | Ledger |
| 5,403,433 A | 4/1995 | Morrison et al. |
| 5,414,514 A | 5/1995 | Smith et al. |
| 5,425,848 A | 6/1995 | Haisma et al. |
| 5,452,090 A | 9/1995 | Progler et al. |
| 5,477,058 A | 12/1995 | Sato |
| 5,480,047 A | 1/1996 | Tanigawa et al. |
| 5,493,401 A | 2/1996 | Horie et al. |
| 5,504,793 A | 4/1996 | Chen |
| 5,508,527 A | 4/1996 | Kuroda et al. |
| 5,512,131 A | 4/1996 | Kumar et al. |
| 5,545,367 A | 8/1996 | Bae et al. |
| 5,563,684 A | 10/1996 | Stagaman |
| 5,563,702 A | 10/1996 | Emery et al. |
| 5,565,114 A | 10/1996 | Saito et al. |
| 5,601,641 A | 2/1997 | Stephens |
| 5,625,193 A | 4/1997 | Broude et al. |
| 5,633,505 A | 5/1997 | Chung et al. |
| 5,669,303 A | 9/1997 | Maracas et al. |
| 5,686,993 A | 11/1997 | Kokubo et al. |
| 5,694,207 A | 12/1997 | Hung et al. |
| 5,719,495 A | 2/1998 | Moslehi |
| 5,724,145 A | 3/1998 | Kondo et al. |
| 5,726,548 A | 3/1998 | Chiba et al. |
| 5,737,064 A | 4/1998 | Inoue et al. |
| 5,740,699 A | 4/1998 | Ballantyne et al. |
| 5,772,905 A | 6/1998 | Chou |
| 5,774,574 A | 6/1998 | Hoki |
| 5,776,748 A | 7/1998 | Singhvi et al. |
| 5,785,918 A | 7/1998 | Hull |
| 5,802,914 A | 9/1998 | Fassler et al. |
| 5,804,017 A | 9/1998 | Hector |
| 5,808,742 A | 9/1998 | Everett et al. |
| 5,812,629 A | 9/1998 | Clauser |
| 5,817,376 A | 10/1998 | Everaerts et al. |
| 5,820,769 A | 10/1998 | Chou |
| 5,837,892 A | 11/1998 | Cavallaro et al. |
| 5,849,209 A | 12/1998 | Kindt-Larsen et al. |
| 5,849,222 A | 12/1998 | Jen et al. |
| 5,853,446 A | 12/1998 | Carre et al. |
| 5,858,580 A | 1/1999 | Wang et al. |
| 5,876,550 A | 3/1999 | Feygin et al. |
| 5,877,032 A | 3/1999 | Guinn et al. |
| 5,877,036 A | 3/1999 | Kawai |
| 5,877,861 A | 3/1999 | Ausschnitt et al. |
| 5,885,472 A | 3/1999 | Miyazaki et al. |
| 5,885,514 A | 3/1999 | Tensor |
| 5,888,650 A | 3/1999 | Calhoun et al. |
| 5,937,758 A | 8/1999 | Maracas et al. |
| 5,948,470 A | 9/1999 | Harrison et al. |
| 5,952,127 A | 9/1999 | Yamanaka |
| 5,956,216 A | 9/1999 | Chou |
| 5,974,150 A | 10/1999 | Kaish et al. |
| 5,999,245 A | 12/1999 | Suzuki |
| 6,016,696 A | 1/2000 | Bair et al. |
| 6,019,166 A | 2/2000 | Viswanath et al. |
| 6,032,549 A | 3/2000 | Tokio et al. |
| 6,038,280 A | 3/2000 | Rossiger et al. |
| 6,046,056 A | 4/2000 | Parce et al. |
| 6,049,373 A | 4/2000 | Miyatake |
| 6,051,179 A | 4/2000 | Hagenau |
| 6,051,345 A | 4/2000 | Huang |
| 6,052,183 A | 4/2000 | Lee |
| 6,068,783 A | 5/2000 | Szetsen |
| 6,074,827 A | 6/2000 | Nelson et al. |
| 6,081,334 A | 6/2000 | Grimbergen et al. |
| 6,088,103 A | 7/2000 | Everett et al. |
| 6,091,485 A | 7/2000 | Li et al. |
| 6,112,588 A | 9/2000 | Cavallaro et al. |
| 6,117,708 A | 9/2000 | Wensel |
| 6,128,085 A | 10/2000 | Buermann et al. |
| 6,133,576 A | 10/2000 | Shafer et al. |
| 6,137,562 A | 10/2000 | Masuyuki et al. |
| 6,150,231 A | 11/2000 | Muller et al. |
| 6,153,886 A | 11/2000 | Hagiwara et al. |
| 6,165,911 A | 12/2000 | Calveley |
| 6,190,929 B1 | 2/2001 | Wang et al. |
| 6,204,922 B1 | 3/2001 | Chalmers |
| 6,218,316 B1 | 4/2001 | Marsh |
| 6,245,581 B1 | 6/2001 | Bonser et al. |
| 6,251,207 B1 | 6/2001 | Schultz et al. |
| 6,261,469 B1 | 7/2001 | Zakhidov et al. |
| 6,274,294 B1 | 8/2001 | Hines |
| 6,278,519 B1 | 8/2001 | Rosencwaig et al. |
| 6,278,809 B1 | 8/2001 | Johnson et al. |
| 6,285,439 B1 | 9/2001 | Miyatake |
| 6,295,120 B1 | 9/2001 | Miyatake |
| 6,297,880 B1 | 10/2001 | Rosencwaig et al. |
| 6,304,326 B1 | 10/2001 | Aspnes et al. |
| 6,305,925 B1 | 10/2001 | Cassani |
| 6,309,580 B1 | 10/2001 | Chou |
| 6,309,957 B1 | 10/2001 | Tu |
| 6,316,290 B1 | 11/2001 | Wensel |
| 6,326,627 B1 | 12/2001 | Putvinski et al. |
| 6,334,960 B1 | 1/2002 | Willson et al. |
| 6,348,999 B1 | 2/2002 | Summersgill et al. |
| 6,355,198 B1 | 3/2002 | Kim et al. |
| 6,383,888 B1 | 5/2002 | Stirton |
| 6,387,787 B1 | 5/2002 | Mancini et al. |
| 6,388,755 B1 | 5/2002 | Zhao |
| 6,391,217 B2 | 5/2002 | Schaffer et al. |
| 6,399,406 B2 | 6/2002 | Chan et al. |
| 6,420,892 B1 | 7/2002 | Krivy et al. |
| 6,446,933 B1 | 9/2002 | Westmoreland |
| 6,482,742 B1 | 11/2002 | Chou |
| 6,489,068 B1 | 12/2002 | Kye |

| | | | | | | |
|---|---|---|---|---|---|---|
| 6,498,640 | B1 | 12/2002 | Ziger | 7,279,113 B2 | 10/2007 | Watts et al. |
| 6,517,977 | B2 | 2/2003 | Resnick et al. | 2001/0023042 A1 | 9/2001 | Dirksen et al. |
| 6,517,995 | B1 | 2/2003 | Jacobson et al. | 2002/0018190 A1 | 2/2002 | Nogawa et al. |
| 6,518,189 | B1 | 2/2003 | Chou | 2002/0042027 A1 | 4/2002 | Chou et al. |
| 6,522,411 | B1 | 2/2003 | Moon et al. | 2002/0069525 A1 | 6/2002 | Hada et al. |
| 6,561,706 | B2 | 5/2003 | Singh et al. | 2002/0093122 A1 | 7/2002 | Choi et al. |
| 6,575,676 | B2 | 6/2003 | Wang et al. | 2002/1168578 | 8/2002 | Wang et al. |
| 6,580,172 | B2 | 6/2003 | Mancini et al. | 2002/0122993 A1 | 9/2002 | Katakura |
| 6,580,505 | B1 | 6/2003 | Bareket | 2002/0132482 A1 | 9/2002 | Chou |
| 6,603,538 | B1 | 8/2003 | Oluseyi et al. | 2002/0135099 A1 | 9/2002 | Robinson et al. |
| 6,605,849 | B1 | 8/2003 | Lutwak et al. | 2002/0150398 A1 | 10/2002 | Choi et al. |
| 6,607,173 | B2 | 8/2003 | Westmoreland | 2002/0159918 A1 | 10/2002 | Tseng et al. |
| 6,621,960 | B2 | 9/2003 | Wang et al. | 2002/0167117 A1 | 11/2002 | Chou |
| 6,630,410 | B2 | 10/2003 | Trapp et al. | 2002/0170880 A1 | 11/2002 | Chen |
| 6,633,391 | B1 | 10/2003 | Oluseyi et al. | 2002/0175298 A1 | 11/2002 | Moniwa et al. |
| 6,636,311 | B1 | 10/2003 | Ina et al. | 2002/0177319 A1 | 11/2002 | Chou |
| 6,646,662 | B1 | 11/2003 | Nebashi et al. | 2003/0025895 A1 | 2/2003 | Binnard |
| 6,664,026 | B2 | 12/2003 | Nguyen et al. | 2003/0034329 A1 | 2/2003 | Chou |
| 6,665,119 | B1 | 12/2003 | Kurtz et al. | 2003/0062334 A1 | 4/2003 | Lee et al. |
| 6,678,038 | B2 | 1/2004 | Binnard | 2003/0080471 A1 | 5/2003 | Chou |
| 6,696,220 | B2 | 2/2004 | Bailey et al. | 2003/0080472 A1 | 5/2003 | Chou |
| 6,713,238 | B1 | 3/2004 | Chou et al. | 2003/0081193 A1 | 5/2003 | White et al. |
| 6,716,754 | B2 | 4/2004 | Hofmann et al. | 2003/0092261 A1 | 5/2003 | Kondo et al. |
| 6,743,368 | B2 | 6/2004 | Lee | 2003/0112421 A1 | 6/2003 | Smith |
| 6,746,319 | B2 | 6/2004 | Tada et al. | 2003/0113638 A1 | 6/2003 | Mancini et al. |
| 6,753,131 | B1 | 6/2004 | Rogers et al. | 2003/0133126 A1 | 7/2003 | Sarfaty et al. |
| 6,753,972 | B1 | 6/2004 | Hirose et al. | 2003/0137494 A1 | 7/2003 | Tulbert |
| 6,770,852 | B1 | 8/2004 | Stegner | 2003/0174435 A1 | 9/2003 | Dinan et al. |
| 6,771,374 | B1 | 8/2004 | Rangarajan et al. | 2003/0179354 A1 | 9/2003 | Araki et al. |
| 6,776,094 | B1 | 8/2004 | Whitesides et al. | 2003/0180631 A1 | 9/2003 | Shiota et al. |
| 6,780,001 | B2 | 8/2004 | Eldridge et al. | 2003/0186140 A1 | 10/2003 | Fries |
| 6,791,669 | B2 | 9/2004 | Poon | 2003/0205657 A1 | 11/2003 | Voisin |
| 6,808,344 | B2 | 10/2004 | Chen | 2003/0205658 A1 | 11/2003 | Voisin |
| 6,808,646 | B1 | 10/2004 | Jeans | 2003/0224262 A1 | 12/2003 | Lof et al. |
| 6,809,356 | B2 | 10/2004 | Chou | 2003/0232252 A1 | 12/2003 | Mancini et al. |
| 6,819,426 | B2 | 11/2004 | Sezginer et al. | 2004/0007799 A1 | 1/2004 | Choi et al. |
| 6,828,244 | B2 | 12/2004 | Chou | 2004/0008334 A1 | 1/2004 | Sreenivasan et al. |
| 6,842,229 | B2 | 1/2005 | Sreenivasan et al. | 2004/0009673 A1 | 1/2004 | Sreenivasan et al. |
| 6,849,558 | B2 | 2/2005 | Schaper | 2004/0021254 A1 | 2/2004 | Sreenivasan et al. |
| 6,852,358 | B1 | 2/2005 | Chen et al. | 2004/0021866 A1 | 2/2004 | Watts et al. |
| 6,852,454 | B2 | 2/2005 | Mancini et al. | 2004/0022888 A1 | 2/2004 | Sreenivasan et al. |
| 6,871,558 | B2 | 3/2005 | Choi et al. | 2004/0033515 A1 | 2/2004 | Cao et al. |
| 6,873,087 | B1 | 3/2005 | Choi et al. | 2004/0036201 A1 | 2/2004 | Chou et al. |
| 6,878,985 | B2 | 4/2005 | Arai et al. | 2004/0046288 A1 | 3/2004 | Chou |
| 6,890,688 | B2 | 5/2005 | Mancini et al. | 2004/0110856 A1 | 6/2004 | Young et al. |
| 6,900,881 | B2 | 5/2005 | Sreenivasan et al. | 2004/0112861 A1 | 6/2004 | Choi et al. |
| 6,902,853 | B2 | 6/2005 | Sreenivasan et al. | 2004/0118809 A1 | 6/2004 | Chou et al. |
| 6,908,861 | B2 | 6/2005 | Sreenivasan et al. | 2004/0124566 A1 | 7/2004 | Sreenivasan et al. |
| 6,916,584 | B2 | 7/2005 | Sreenivasan et al. | 2004/0131718 A1 | 7/2004 | Chou et al. |
| 6,916,585 | B2 | 7/2005 | Sreenivasan et al. | 2004/0137734 A1 | 7/2004 | Chou et al. |
| 6,919,152 | B2 | 7/2005 | Sreenivasan et al. | 2004/0141163 A1 | 7/2004 | Bailey et al. |
| 6,921,615 | B2 | 7/2005 | Sreenivasan et al. | 2004/0146792 A1 | 7/2004 | Nimmakayala et al. |
| 6,922,906 | B2 | 8/2005 | Choi et al. | 2004/0150129 A1 | 8/2004 | Hougham et al. |
| 6,929,762 | B2 | 8/2005 | Rubin | 2004/0156108 A1 | 8/2004 | Chou et al. |
| 6,932,934 | B2 | 8/2005 | Choi et al. | 2004/0163563 A1 | 8/2004 | Sreenivasan et al. |
| 6,946,360 | B2 | 9/2005 | Chou | 2004/0168586 A1 | 9/2004 | Bailey et al. |
| 6,954,275 | B2 | 10/2005 | Choi et al. | 2004/0189994 A1 | 9/2004 | Sreenivasan et al. |
| 6,955,767 | B2 | 10/2005 | Chen | 2004/0189996 A1 | 9/2004 | Sreenivasan et al. |
| 6,964,793 | B2 | 11/2005 | Willson et al. | 2004/0192041 A1 | 9/2004 | Jeong et al. |
| 6,986,975 | B2 | 1/2006 | Sreenivasan et al. | 2004/0197843 A1 | 10/2004 | Chou et al. |
| 7,027,156 | B2 | 4/2006 | Watts et al. | 2004/0202865 A1 | 10/2004 | Homola et al. |
| 7,037,639 | B2 | 5/2006 | Voisin | 2004/0209177 A1 | 10/2004 | Sreenivasan et al. |
| 7,070,405 | B2 | 7/2006 | Sreenivasan et al. | 2004/0219246 A1 | 11/2004 | Jeans |
| 7,077,992 | B2 | 7/2006 | Sreenivasan et al. | 2004/0223131 A1 | 11/2004 | Choi et al. |
| 7,098,572 | B2 | 8/2006 | Choi et al. | 2004/0223883 A1 | 11/2004 | Choi et al. |
| 7,117,583 | B2 | 10/2006 | Dinan et al. | 2004/0250945 A1 | 12/2004 | Zheng et al. |
| 7,122,482 | B2 | 10/2006 | Xu et al. | 2005/0006343 A1 | 1/2005 | Choi et al. |
| 7,128,875 | B2 | 10/2006 | Cubicciotti | 2005/0028618 A1 | 2/2005 | Choi et al. |
| 7,136,150 | B2 | 11/2006 | Sreenivasan et al. | 2005/0037143 A1 | 2/2005 | Chou et al. |
| 7,140,861 | B2 | 11/2006 | Watts et al. | 2005/0051698 A1 | 3/2005 | Sreenivasan et al. |
| 7,179,079 | B2 | 2/2007 | Sreenivasan et al. | 2005/0051742 A1 | 3/2005 | Shiraishi |
| 7,186,483 | B2 | 3/2007 | Sreenivasan et al. | 2005/0064344 A1 | 3/2005 | Bailey et al. |
| 7,229,273 | B2 | 6/2007 | Bailey et al. | 2005/0067379 A1 | 3/2005 | Sreenivasan et al. |

| | | | |
|---|---|---|---|
| 2005/0084804 A1 | 4/2005 | Truskett et al. | |
| 2005/0098534 A1 | 5/2005 | Sreenivasan et al. | |
| 2005/0100830 A1 | 5/2005 | Xu et al. | |
| 2005/0158637 A1 | 7/2005 | Kim et al. | |
| 2005/0184436 A1 | 8/2005 | Jeong et al. | |
| 2005/0230882 A1 | 10/2005 | Watts et al. | |
| 2005/0271955 A1 | 12/2005 | Cherala et al. | |
| 2005/0274219 A1 | 12/2005 | Choi et al. | |
| 2005/0275251 A1 | 12/2005 | Choi et al. | |
| 2005/0275311 A1 | 12/2005 | Choi et al. | |
| 2006/0005657 A1 | 1/2006 | Choi et al. | |
| 2006/0032437 A1 | 2/2006 | McMackin et al. | |
| 2006/0062867 A1 | 3/2006 | Choi et al. | |
| 2006/0076717 A1 | 4/2006 | Sreenivasan et al. | |
| 2006/0077374 A1 | 4/2006 | Sreenivasan et al. | |
| 2006/0114450 A1 | 6/2006 | Nimmakayala et al. | |
| 2006/0115999 A1 | 6/2006 | Sreenivasan et al. | |
| 2006/0126058 A1 | 6/2006 | Nimmakayala et al. | |
| 2006/0158651 A1 | 7/2006 | Watts et al. | |
| 2006/0172031 A1 | 8/2006 | Babbs et al. | |
| 2006/0177535 A1 | 8/2006 | McMackin et al. | |
| 2006/0266916 A1 | 11/2006 | Miller et al. | |
| 2007/0026542 A1 | 2/2007 | Sreenivasan et al. | |
| 2007/0122942 A1 | 5/2007 | Sreenivasan et al. | |

FOREIGN PATENT DOCUMENTS

| | | |
|---|---|---|
| EP | 0298425 | 10/1992 |
| EP | 0411032 | 5/1994 |
| EP | 0581620 | 2/1998 |
| EP | 0974458 A1 | 12/2001 |
| EP | 0839769 | 1/2002 |
| EP | 0872456 | 1/2002 |
| EP | 1460738 A2 | 9/2004 |
| GB | 494877 | 11/1938 |
| GB | 1139808 | 1/1969 |
| JP | 55-88332 | 7/1980 |
| JP | 57-7931 | 1/1982 |
| JP | 61-40845 | 2/1986 |
| JP | 63-138730 | 6/1988 |
| JP | 63-165118 | 7/1988 |
| JP | 1-196749 | 8/1989 |
| JP | 1-234213 | 9/1989 |
| JP | 02-24848 | 1/1990 |
| JP | 2-063803 | 3/1990 |
| JP | 02-92603 | 4/1990 |
| JP | 02192045 | 7/1990 |
| JP | 2-248480 | 10/1990 |
| JP | 3-90345 | 4/1991 |
| JP | 9-278490 | 10/1997 |
| JP | 11-060255 | 3/1999 |
| JP | 2005-2677380 | 9/2005 |
| JP | 2006-315207 | 11/2006 |
| WO | WO 87/02935 | 5/1987 |
| WO | WO 99/05724 | 2/1999 |
| WO | WO 00/21689 | 4/2000 |
| WO | WO 01/47003 | 6/2001 |
| WO | WO 01/90816 | 11/2001 |
| WO | WO 02/07199 | 1/2002 |
| WO | WO 02/22916 | 3/2002 |
| WO | WO 02/064519 | 8/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |

OTHER PUBLICATIONS

Bender et al., High resolution lithography with PDMS molds, J. Vac. Sci. Technol. B, vol. 22, No. 6 (Nov./Dec. 2004), pp. 3229-3232.*

Huang et al., Reversal imprinting by transferring polymer from mold to substrate, J. Vac. Sci. Technol. B, vol. 20, No. 6 (Nov./Dec. 2002), pp. 2872-2876.*

Feldman et al., "Wafer Chuck for Magnification correction in X-ray Lithography," Journal of Vacuum Science and Technology, Nov./Dec. 1998, pp. 3476-3479, vol. B 16(6).

U.S. Appl. No. 10/687,519, filed Oct. 16, 2003, Nguyen et al.
U.S. Appl. No. 10/864,214, filed Jun. 9, 2004, Sreenivasan et al.
U.S. Appl. No. 10/858,179, filed Jun. 1, 2004, Choi et al.
U.S. Appl. No. 10/858,100, filed Jun. 1, 2004, Choi et al.
U.S. Appl. No. 10/827,118, filed Apr. 19, 2004, Watts et al.
U.S. Appl. No. 10/706,537, filed Nov. 12, 2003, Sreenivasan et al.
U.S. Appl. No. 10/833,240, filed Apr. 27, 2004, Watts et al.
U.S. Appl. No. 10/917,761, filed Aug. 13, 2004, McMackin et al.
U.S. Appl. No. 11/051,941, filed Feb. 4, 2005, McMackin et al.
U.S. Appl. No. 11/000,331, filed Nov. 30, 2004, Nimmakayala et al.
U.S. Appl. No. 11/000,321, filed Nov. 30, 2004, Nimmakayala et al.

Chou, Nanoimprint Lithography and Lithographically Induced Self-Assembly, MRS Bulletin, pp. 512-517, Jul. 1, 2001.

Choi et al., Design of Orientation Stages for Step and Flash Imprint Lithography, Precision Engineering, pp. 192-199, Jan. 1, 2001.

Colburn et al., Step and Flash Imprint Lithography for sub-100 nm Patterning, Proceedings of SPIE vol. 3997, pp. 453-457, Jan. 1, 2000.

Chou et al., Imprint Lithography with 25-Nanometer Resolution, Science vol. 272, pp. 85-87, Apr. 5, 1996.

Chou et al., Imprint Lithography with Sub-10 nm Feature Size and High Throughput, Microelectronic Engineering 35, pp. 237-240, Jan. 1, 1997.

Haisma et al., Mold-assisted Nanolithography: A Process for Reliable Pattern Replication, J. Vac. Sci. Technol. B, pp. 4124-4128, Nov. 1, 1996.

Chou et al., Imprint of Sub-25 nm Vias and Trenches in Polymers, Appl. Phys. Lett. 67 (21), Nov. 20, 1995.

Johnson et al., Advances in Step and Flash Imprint Lithography, SPIE Microlithography Conference, Feb. 23, 2003.

Chou et al., Lithographically Induced Self-assembly of Periodic Polymer Micropillar Arrays, J. Vac. Sci. Technol. B 17 (6), pp. 3197-3202, Nov. 1, 1999.

Colburn et al., Step and Flash Imprint Lithography: A New Approach to High-Resolution Patterning, Proc. Of SPIE, vol. 3676, Mar. 1, 1999.

Heidari, Nanoimprint Lithography at the 6 in. Wafer Scale, J. Vac. Sci. Technol. B 18(6), pp. 3557-3560, Nov. 1, 2000.

Translation of Japanese Patent 02-92603.
Translation of Japanese Patent 02-24848.

Chou et al., Ultrafast and Direct Imprint of Nanostructures in Silicon, Nature, col. 417, (Jun. 2002), pp. 835-837, Jun. 1, 2002.

Moon et al., Interferometric-Spatial-Phase Imaging for Six-Axis Mask Control, MIT NanoStructures Laboratory, Research Laboraty of Electronics, Oct. 17, 2003.

Shibuichi et al., Super Water- and Oil-Repellent Surfaces Resulting from Fractal Structure, Journal of Colloid and Interface Science, vol. 208, No. 1, pp. 287-294, Dec. 1, 1998.

Chou et al., Nanoimprint Lithography, Journal of Vacuum Science Technolgoy B 14(16), pp. 4129-4133, Nov. 1, 1996.

Colburn et al., Development and Advantages of Step-and-Flash Lithography, Solid State Technology, Jul. 1, 2001.

Resnick et al., High Resolution Templates for Step and Flash Imprint Lithography, Journal of Microlithography, Microfabrication, and Microsystems. vol. 1. No. 3., Oct. 1, 2002.

Colburn et al., Characterization and Modeling of Volumetric and Mechanical Properties for Step and Flash Imprint Lithography Photopolymers, Journal of Vacuum Science Technology. vol. b. 19(6), Nov. 1, 2001.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Wronosky et al., Wafer and Reticle Positioning System for the Extreme Ultraviolet Lithography Engineering Test Stand, Emerging Lithography Technologies, Proceedings of SPIE vol. 3997, pp. 829-839, Jul. 1, 2000.

Schneider et al., Stripes of Partially Fluorinated Alkyl Chains: Dipolar Langmuir Monolayers.

Park et al., Aligning Liquid Crystals Using Replicated Nanopatterns, PSI Scientific Report 2002, vol. VII, p. 85, Mar. 1, 2003.
Abstract of Japanese Patent 57-7931.
Abstract of Japanese Patent 55-88332.
Abstract of Japanese Patent 63-138730.
Taniguchi et al., Diamond Nanoimprint Lithography, Nanotechnology, 2002, vol. 13, No. 5, pp. 592-596(5) Jan. 1, 2002.
Kiyohara et al., Abstract of Plasma Etching of CVD Diamond Films using an ECR-type Oxygen Source, http://www.iop.org/EJ/abstract/0957-4484/10/4/304 Sep. 26, 2003.
U.S. Appl. No. 11/126,946, naming Inventors Choi et al., entitled Formation of Discontinuous Films During an Imprint Lithography Process, filed May 11, 2005.
U.S. Appl. No. 11/127,041, naming Inventors Sreenivasan et al., entitled Step and Repeat Imprint Lithography Processes, filed May 11, 2005.
U.S. Appl. No. 11/127,060, naming Inventors Sreenivasan et el., entitled Step and Repeat Imprint Lithography Systems, filed May 11, 2005.
U.S. Appl. No. 11/136,897, naming Inventors Miller et al., entitled Imprint Lithography Template Having a Coating to Reflect and/or Absorb Actinic Energy, filed May 25, 2005.
U.S. Appl. No. 11/143,076, naming Inventors Cherala et al., entitled System and Method for Improvement of Alignment and Overlay for Microlithography, filed Jun. 2, 2005.
U.S. Appl. No. 11/142,838. naming Inventors Choi et al., entitled Compliant Device for Nano-Scale Manufacturing, filed Jun. 1, 2005.
U.S. Appl. 11/142,825, naming Inventors Choi et al., entitled Method and System to Control Movement of a Body for Nano-Scale Manufacturing. filed Jun. 1, 2005.
Thompson et al., Fabrication of Step and Flash Imprint Lithography Templates Using Commercial Mask Processes, SPIE Microlithography Conference Feb. 1, 2003.
Arai et al., Development of a New Parallel Manipulator with Fixed Linear Actuator, In Proceedings of Japan/USA Symposium on Flexible Automation, vol. 1, ASME, New York, pp. 145-149 Jan. 1, 1996.
Williams et al., Six Degree of Freedom Mag-Lev Stage Development, SPIE vol. 3051, 856-867 Jan. 1, 1997.
Wang et al., Passive Compliance versus Active Compliance in Robot-Based Automated Assembly Systems, Industrial Robot vol. 25, No. 1, pp. 48-57 Jan. 1, 1998.
Rong et al., Design and Analysis of Flexure-Hinge Mechanism Used in Micro-Positioning Stages, ASME vol. 2, pp. 979-985 Jan. 1, 1994.
Feynman, There's Plenty of Room at the Bottom, Dec. 1, 1959.
Xia et al., Soft Lithography, Angew. Chem. Int. Ed., pp. 550-575 Jan. 1, 1998.
Mansky et al., Large-Area Domain Alignment in Block Copolymer Thin Films Using Electric Fields, Macromolecules. vol. 31. No. 13, pp. 4399-4401 Jun. 9, 1998.
Krug et al., Fine Patterning of Thin Sol-gel Films, Journal of Non-Crystalline Solids 147 & 148, pp. 447-450 Jan. 1, 1992.
Martin et al., Predication of Fabrication Distortions in Step and Flash Imprint Lithography Templates, Journal of Vacuum Science Technology B 20(6), pp. 2891-2895 Nov. 1, 2002.
White et al., Novel Alignment System for Imprint Lithography, J. Vac. Sci. Technol. B 18(6), pp. 3552-3556 Nov. 1, 2000.
Nguyen, Asymmetric Fluid-Structure Dynamics in Nanoscale Imprint Lithography, The University of Texas at Austin, pp. 1-111 Aug. 1, 2001.
Uchida et al., A Mask-to-Wafer Alignment and Gap Setting Method for X-ray Lithography Using Gratings, J. Vac. Sci. Technol. B 9 (6), pp. 3202-3206 Nov. 1, 1991.
Mitsui et al., Application of Two-Wavelength Optical Heterodyne Alignment System in XS-1, Part of the SPIE Conference on Emerging Lithographic Technologies III, SPIE vol. 3676, pp. 455-464 Mar. 1, 1999.
Abstract of Japanese Patent 02-92603, Aug. 12, 2004.
Abstract of Japanese Patent 02-24848, Jan. 26, 1990.
Office Action from U.S. Appl. No. 10/053,357, Dec. 16, 2003.
Sowah, Diamond used to Break the Mould, Retrieved Sep. 2, 2003 from URL: http://www.electronictimes.com/story/OEG20020918S0003 Sep. 18, 2002.
Armitage et al., Analysis of Overlay Distortion Patterns, SPIE vol. 921 Integrated Circuit Metrology, Inspection, and Process Control II Jan. 1, 1988.
Chen et al., Adaptive Alignment of Photomasks for Overlay Placement, Journal of Vacuum Science. B 20(6), pp. 3099-3105 Nov. 1, 2002.
Schneider et al., The Wave-Printer: Towards Large-Area, Multilayer Microcontact-Printing, Proc. Of 4th euspen International Conference, Glasgos, Scotland (UK) May 1, 2004.
U.S. Appl. No. 10/782,187, naming Inventors McMackin et al., entitled Method and System to Measure Characteristics of a Film Disposed on a Substrate, filed Feb. 19, 2004.
U.S. Appl. No. 10/999,898, naming Inventors Cherala et al., entitled System for Magnification and Distortion Correction during Nano-Scale Manufacturing, filed Nov. 30, 2004.
U.S. Appl. No. 10/996,126, naming Inventors Sreenivasan et al., entitled Method of Inspecting Substrates Employing Signal Superimposition, filed Nov. 23, 2004.
Deng et al., Simulation of Exposure and Alignment for Nano-imprint Lithography, Proc. SPIE, vol. 4688-93, p. 842-849 Jan. 1, 2002.
Deng et al., Rigorous Electromagnetic Simulation Applied to Alignment Systems, Proc. SPIE, vol. 4346-164, p. 1533-1540 Jan. 1, 2001.
U.S. Appl. No. 11/142,808, naming Inventors Cherala et al., entitled System for Varying Dimensions of a Substrate during Nano-Scale Manufacturing, filed Jun. 1, 2005.
U.S. Appl. No. 11/142,834, naming Inventors Cherala et al., entitled Method of Varying Dimensions of a Substrate during Nano-Scale Manufacturing, filed Jun. 1, 2005.
U.S. Appl. No. 11/142,839, naming Inventors Cherala et al., entitled Apparatusa to Vary Dimensions of a Substrate during Nano-Scale Manufacturing, filed Jun. 1, 2005.
Abstract of Japanese Patent 61-040845, Feb. 27, 1986.
Abstract of Japanese Patent 02-248480, Oct. 4, 1990.
Abstract of Japanese Patent 3-090345, Apr. 16, 1991.
Abstract of Japanese Patent 09-278490, Oct. 28, 1997.
Myron et al., Advanced Mask Metrology Enabling Characterization of Imprint Lithography Templates, SPIE Microlithography Conference Feb. 1, 2005.
Choi et al., Distortion and Overlay Performance of UV Step and Repeat Imprint Lithography, MNE Micro- and Nano-Engineering Conference Sep. 1, 2004.
Gehoski et al., Indium Tin Oxide Template Development for Step and Flash Imprint Lithgraphy, SPIE Microlithography Conference Feb. 1, 2005.
Dauksher et al., Repair of Step and Flash Imprint Lithography Templates, J. Vac. Sci. Technol. B 22(6), pp. 3306-3311 Nov. 1, 2004.
Nordquist et al., Image Placement Issues for ITO-based Step and Flash Imprint Lithography Templates, J. Vac. Sci. Technol. B, pp. 695-701 Mar. 1, 2004.
Gehoski et al., Evaluation of the Imprio 100 Step and Flash Imprint Lithography Tool, Proceedings of SPIE, vol. 5374, pp. 1006-1016 May 1, 2004.
Dauksher et al., Step and Flash Imprint Lithography Template Characterization, from an Etch Perspective, J. Vac. Sci. Technol. B 21(6), pp. 2771-2776 Nov. 1, 2003.
Resnick et al., Imprint Lithography: Lab Curiosity or the Real NGL?, SPIE Microlithography Conference Feb. 1, 2003.
Mancini et al., Analysis of Critical Dimension Uniformity for Step and Flash Imprint Lithography, SPIE Microlithography Conference Feb. 1, 2003.
Mancini et al., Hydrogen Silsesquioxane for Direct Electron-Beam Patterning of Step and Flash Imprint Lithography Templates, J. Vac. Sci. Technol. B 20(6), pp. 2896-2901 Nov. 1, 2002.
Dauksher et al., Characterization of and Imprint Results Using Indium Tin Oxide-Based Step and Flash Imprint Lithography Templates, J. Vac. Sci. Technol. B 20(6), pp. 2857-2861 Nov. 1, 2002.
Nordquist et al.Q, Critical Dimension and Image Placement Issues for Step and Flash Imprint Lithography Templates, 22nd Annual BACUS Symposium on Photomask Technology, Monterey, CA Sep. 1, 2002.
Bailey et al., Template Fabrication Schemes for Step and Flash Imprint Lithography, Microelectronic Engineering, 61-62, pp. 461-467 Jan. 1, 2002.

Resnick et al., High Resolution Templates for Step and Flash Imprint Lithography, SPIE Microlithography Conference Feb. 1, 2002.
Resnick et al., New Methods for Fabricating Step and Flash Imprint Lithography Templates, NIST-SPIE Conference on Nanotechnology Sep. 1, 2001.
Choi et al., Layer-to-Layer Alignment for Step and Flash Imprint Lithography, SPIE's 26th Intl. Symp. Microlithography: Emerging Lithographic Technologies, Santa Clara, CA Mar. 1, 2001.
Hess et al., Inspection of Templates for Imprint Lithography, J. Vac. Sci. Technol. B 22(6) Nov. 1, 2004.
Yoneda et al., Translation of Japanese Patent 02-248480, Transparent Substrate with Water-Repellent and Antistaining Properties, and Structure Equipped Therewith Oct. 4, 1990.
Yoneda et al., Translation of Japanese Patent 02-248480, Transparent Substrate Material with Water-Repllent and Anti-Staining Properties and Structure Equipped with Same Oct. 4, 1990.
Kirby et al., In-Situ Fabrication of Dialysis Membranes in Glass Microchannels using Laser-induced Phase-Separation Polymerization, MicroTAS 2002, p. 742-744 Jan. 1, 2002.
Translation of Japanese Patent 61-40845, Feb. 1, 1986.
Translation of Japanese Patent 02-248480, Oct. 1, 1990.
Translation of Japanese Patent 03-090345, Apr. 1, 1991.
Translation of Japanese Patent 09-278490, Oct. 1, 1997.
Abstract of Japanese Patent 03-090345, Apr. 1, 1991.
Abstract of Japanese Patent 09-278490, Oct. 1, 1997.
U.S. Appl. No. 11/373,533, naming Inventors Sreenivasan et al., entitled Alignment Systems for Imprint Lithography, filed Mar. 10, 2006.
Bien et al., Characterization of Masking Materials for Deep Glass Micromachining, J. Micromech. Microeng. 13 pp. S34-S40 Jan. 1, 2003.
Britten et al., Multiscale, Multifuncation Diffractive Structures We Etched into Fused Silica for High-Laser Damage Threshold Applications, Applied Optics, vol. 37, No. 30 Oct. 20, 1998.
Fletcher et al., Microfabricated Silicon Solid Immersion Lens, Jounral of Microelectromechanical Systems, vol. 10, No. 3 Sep. 1, 2001.
Khandaker et al., Fabrication of Microlens Arrays by Direct Electron Beam Exposure of Photoresist, Pure Appl. Opt. 6, pp. 637-641 Jan. 1, 1997.
Kim et al., Replication Qualities and Optical Properties of UV-moulded Microlens Arrays, J. Phys. D: Appl. Phys. 36; pp. 2451-2456 Jan. 1, 2003.
Kobayashi et al., Batch Bulk-Mircomachined High-Precision Metal-On-Insulator Microspires and Their Application to Scanning Tunneling Microscopy, J. Micromech. Microeng. 14; pp. S76-S81 Jan. 1, 2004.
Konijn et al., Nanoimprint Lithography of Sub-100nm 3D Structures, Microelectronic Engineering 78-79; pp. 653-658 Jan. 1, 2005.
Kunnavakkam et al., Low-cost, Low-loss Microlens Arrays Fabricated by Soft-Lithography Replication Process, Applied Physics Letters, vol. 82, No. 8 Feb. 24, 2003.
Mansell et al., Binary-Optic Smoothing with Isotropic Etching, Applied Optics; vol. 36, No. 20 Jul. 10, 1997.
Waheed et al., Balancing Aerial Image Intensity for Alternating Aperture Phase Shift Masks Using an Isotropic Dry-Etch, Proceedings of SPIE vol. 5130 Apr. 18, 2003.
Sano et al., Submicron Spaced Lens Array Process Technology for a High Photosensitivity CCD Image Sensor, IEEE IEDM Dig.; pp. 283-286 Jan. 1, 1990.
Tsukamoto et al., High Sensitivity Pixel Technology for a 1/4 inch PAL 430k pixel IT-CCD, IEE Custom Integrated Circuits Conference Jan. 1, 1996.
Colburn et al., Dissertation for the Degree of Doctor of Philosophy, Step and Flash Imprint Lithography: A Low-Pressure, Room-Temperature Nanoimprint Lithography Aug. 1, 2001.
Morita et al., Three-Dimensional Nanoimprint Fabrication by Focused-Ion-Beam Chemical Vapor Deposition, Jpn. J. Appl. Phys., vol. 42, Pt. 1, No. 6B, pp. 3874-3876 Jan. 1, 2003.
U.S. Appl. No. 11/687,902, naming Inventors Cherala et al., entitled System to Vary Dimensions of a Thin Template, filed Mar. 19, 2007.
U.S. Appl. No. 11/695,469, naming Inventors Cherala et al., entitled Deformation Using Nullspace and Methods Optimization Techniques, filed Apr. 2, 2007.
U.S. Appl. No. 11/695,850, naming Inventors Sreenivasan et al., entitled Method of concurrently patterning a substrate having a plurality of fields and a plurality of alignment marks, filed Apr. 3, 2007.
U.S. Appl. No. 11/694,644, naming Inventors Nimmakayala et al., entitled Enhanced Multi Channel Alignment, filed Mar. 30, 2007.
U.S. Appl. No. 11/694,193, naming Inventors Shackleton et al., entitled Preserving Filled Features when Vacuum Wiping, filed Mar. 30, 2007.
U.S. Appl. No. 11/744,698, naming Inventors Resnick et al., entitled Template Having a Varying Thickness to Facilitate Expelling a Gas Positioned Between a Substrate and the Template, filed May 4, 2007.
Farhadinia, Finite Element Analysis and Experimental Evaluation of Buckling Phenomena in Laminated Composite Tubes and Plates, Diss. Abstr. Int. Jan. 1, 1992.
Anisovich et al., Penetration of Gases into Metal in Gating Systems, Kokl. Akad. Nauk Bearusi Mar. 1, 1984.
Abstract of Japanese Patent 11-060255.
Abstract of Japanese Patent 1-234213.
Abstract of Japanese Patent 63-165118.
Abstract of Japanese Patent 2-063803.
Abstract of Japanese Patent 2006-315207.
Hara K et al., An Alignment Technique using Diffracted Moire Signals, Journal of Facuum Science and Technology: Part B, AVS/AIP, Melville, New York, NY, US, vol. 7, No. 6; pp. 1977-1979 Nov. 1, 1989.
U.S. Appl. No. 11/762,378, naming Inventors McMackin et al., entitled Imprint Lithography Template to Facilitate Control of Liquid Movement, filed Jun. 13, 2007.
U.S. Appl. No. 11/760,855, naming Inventors Bailey et al., entitled Imprint Lithography Template Having a Feature Size Under 250 nm, filed Jun. 11, 2007.
Abstract of Japanese patent 02-192045, Jul. 27, 1990.

* cited by examiner

IMPRINT ALIGNMENT METHOD, SYSTEM, AND TEMPLATE

BACKGROUND OF THE INVENTION

1. Field of the Invention

The present invention relates to a method of improving imprint lithography alignment as well as a system and template to be used for same. The method, system, and template herein described have particular utility in subfield alignment of sub 100 nm features requiring registration of about 25 nm.

2. Description of the Related Art

Micro-fabrication involves the fabrication of very small structures, e.g., having features on the order of micrometers or smaller. One industry that has been driving the fabrication of increasingly smaller structures is the electronics industry. As electronic devices have become smaller and faster, the integrated circuits that drive them have necessarily become smaller.

A technique known as 'photolithography', or simply 'lithography', is typically employed in the manufacture of integrated circuits. Lithographic techniques are generally used to pattern the various levels of an integrated circuit. Typically, these lithographic techniques include applying a photosensitive material to a semiconductor substrate. These photosensitive materials, commonly referred to as "resist," are selectively exposed to a form of radiation. An exposure tool and photomask are often used to obtain the desired selective exposure. Such exposure changes the solubility of the resist such that the photomask's pattern is formed in the resist following a development process to remove the soluble resist. The resulting patterned resist serves to protect underlying conductive or dielectric material from etching or ion implantation.

It is critical to align successive layers of an integrated circuit to each other to ensure proper operation of the circuit. In particular, the photomask pattern must be properly aligned to previously formed semiconductor topography features during the lithography process. In the extreme, lithographic misalignment may lead to shorting between structures that should be isolated from each other, and isolation of structures that should be coupled to each other.

Imprint lithography is capable of manufacturably producing sub-100 nm features. Several imprint lithography techniques have been investigated as low cost, high volume manufacturing alternatives to conventional photolithography for high-resolution patterning. In this emergent technology, a relief image in a template is used to replicate a surface relief into a polymerizable material arranged upon the surface of a substrate. The template makes mechanical contact with the material arranged upon the substrate, and the material is subjected to conditions to solidify and/or to polymerize the same such that a relief structure complimentary to that of the template is formed on the substrate. The material may be solidified or polymerized by, for example, heat or actinic light. Such patterning and polymerization techniques may be referred to as thermal imprint lithography or ultraviolet ('UV') imprint lithography, respectively. Typical substrates may include semiconductors, dielectric materials, magnetic materials, or optoelectronic materials.

Imprint lithography may be used in wide variety of applications. That is, imprint lithography applications are not limited to the manufacture of integrated circuits. However, typical applications require alignment of subsequently imprinted device layers to previously imprinted device layers. Properly aligning subsequent imprint lithography device layers becomes increasingly difficult as feature sizes become ever smaller. Imprint lithography systems are currently capable of printing features in the sub-100 nm range with a 3σ overlay alignment capability of less than about 500 nm. Despite a high degree of alignment accuracy, current imprint lithography systems are challenged by the degree of precision required to consistently align multiple layers having minimum feature sizes. Devices having such minimum feature sizes may also have registration tolerances of about 25 nm or less. Consequently, proper alignment of multi-layered devices having minimum feature sizes may be a relatively infrequent event. It is desired, therefore, to provide improvement to imprint lithography alignment.

SUMMARY OF THE INVENTION

Presented herein is an improved alignment method with particular utility in imprint lithography applications. In an embodiment, the method of improving lithographic alignment essentially comprises imprinting a first layer on a substrate and imprinting a second layer on the first layer, the first layer including an array of first-layer geometries each arranged within a respective subfield with each first-layer geometry including at least one first-layer feature, and the second layer including an array of second-layer geometries each arranged within a respective subfield with each second-layer geometry including at least one second-layer feature, where at least one second-layer feature has at least one corresponding first-layer feature, where at least one second-layer geometry has a corresponding first-layer geometry, and where at least one second-layer geometry is intentionally offset from its corresponding first-layer geometry. In an embodiment, at least two second-layer geometries are intentionally offset from their corresponding first layer geometries, and said offsets are not equal.

Also in an embodiment, the present invention essentially comprises a method of improving lithographic alignment between subsequent imprinted device layers within a subfield. Such a method includes establishing an (x,y) grid whereby a centermost point of a subfield arranged within a central region has (x,y) coordinates (0,0). Such a method further includes establishing an array having 'N' subfields arranged in 'J' rows and 'K' columns, where each column has a width 'w' and each row has a height 'h', and a device is arranged entirely within a single subfield. The method further includes imprinting a first layer having an array of 'N' first-layer geometries, where a centermost point of a central first-layer geometry has (x,y) coordinates (0,0), where a centermost point of each first-layer geometry is commensurate with a centermost point of its respective subfield, where a centermost point of a first-layer geometry is a spaced distance 'w' from a centermost point of an immediately laterally adjacent first-layer geometry, and where a centermost point of a first-layer geometry is a spaced distance 'h' from a centermost point of an immediately vertically adjacent first-layer geometry. The method further includes imprinting a second layer, where the second layer includes an array of 'N' second-layer geometries, where each second-layer geometry has a corresponding first-layer geometry, where a centermost point of a central second-layer geometry has (x,y) coordinates (0,0), where a centermost point of a second-layer geometry is a spaced distance 'w+Δw' from a centermost point of an immediately laterally adjacent second-layer geometry and a centermost point of a second-layer geometry is a spaced distance 'h+Δh' from a centermost point of an immediately vertically adjacent first-layer geometry, where Δw and Δh are both non-zero.

Also in an embodiment, the present invention essentially comprises a set of lithography templates providing improved lithographic alignment. Such a template set includes a first template having an array of first geometries and a second template having an array of second geometries, where each second geometry has a corresponding first geometry, and where at least one second geometry is intentionally offset from its corresponding first geometry.

These and other embodiments are herein described.

BRIEF DESCRIPTION OF THE DRAWINGS

The same reference numerals refer to the same parts throughout the various figures.

DETAILED DESCRIPTION OF THE INVENTION

Although an imprint lithography system may have a high degree of alignment accuracy, the alignment precision may not suffice for multi-layered devices having sub 100 nm features. Using typical lithography methods, systems, and devices, a system having a three sigma alignment accuracy of less than about 500 nm may not be sufficient to produce functional, multi-layered devices having, for example, registration tolerances of about 25 nm or less, and having minimum feature sizes of, for example, about 50 nm or less. An exemplary lithographic system is available under the trade name IMPRIO 100™ from Molecular Imprints, Inc. having a place of business at 1807-C Braker Lane, Suite 100, Austin, Tex. 78758. The system description for the IMPRIO 100™ is available at www.molecularimprints.com and is incorporated herein by reference.

Typically all the layers within a respective print field are replicated substantially identically, resulting in substantially identical devices within each print field. This strategy is useful when producing devices which have design tolerances well within the capabilities of the lithography system, or subsystems, used. In such cases, successful device production may be defined by a high yield of functional devices. However, the instant invention is intended to aid in producing leading-edge devices that have design tolerances which test the capabilities of the best lithography systems now available. In the manufacture of such leading-edge devices, success may be defined as producing as few as a single functional device on an entire wafer. Where design tolerances such as alignment or registration test the limits of a lithography system, success may be attained by deliberately offsetting device features. That is, it may be desirable to deliberately offset features of an imprinted image within an individual subfield as described below.

Figure 1:
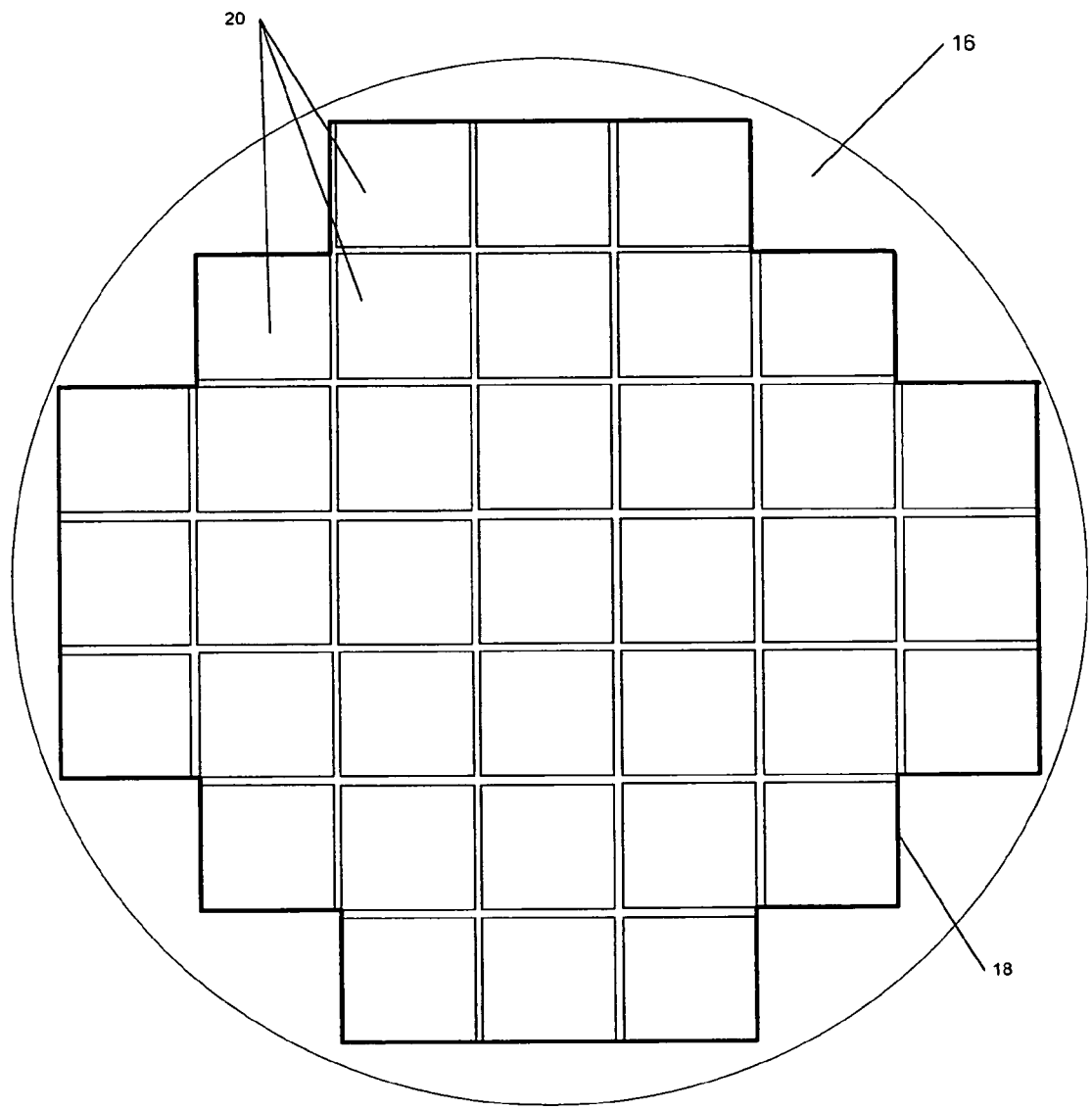
FIG. 1 is a plan view of a wafer substrate illustrating the wafer field and the print fields which comprise the wafer field.

FIG. 1 illustrates substrate 16, which in this case is a semiconductor wafer. Upon substrate 16, a wafer field 18, comprising print fields 20, is defined. Typically, a wafer field 18 is comprised of an integral number of print fields 20. The dimensions of a print field may be as large as a lithography system's maximum field. An imprint lithography system' maximum field is the largest area the system can simultaneously imprint. That is, the maximum area that can be imprinted with one flash. In an embodiment, the maximum field size of an imprint lithography system is 25 mm×25 mm.

An optical lithography system's maximum field is the largest area the system can expose in one exposure. A wide variation of maximum optical lithography field sizes exist, ranging from about 25 mm×33 mm to about 800 mm×920 mm. Although the instant invention is directed toward an imprint lithography system, the methods, systems, and templates described herein may also be applicable to at least some optical lithography systems.

Figure 2:
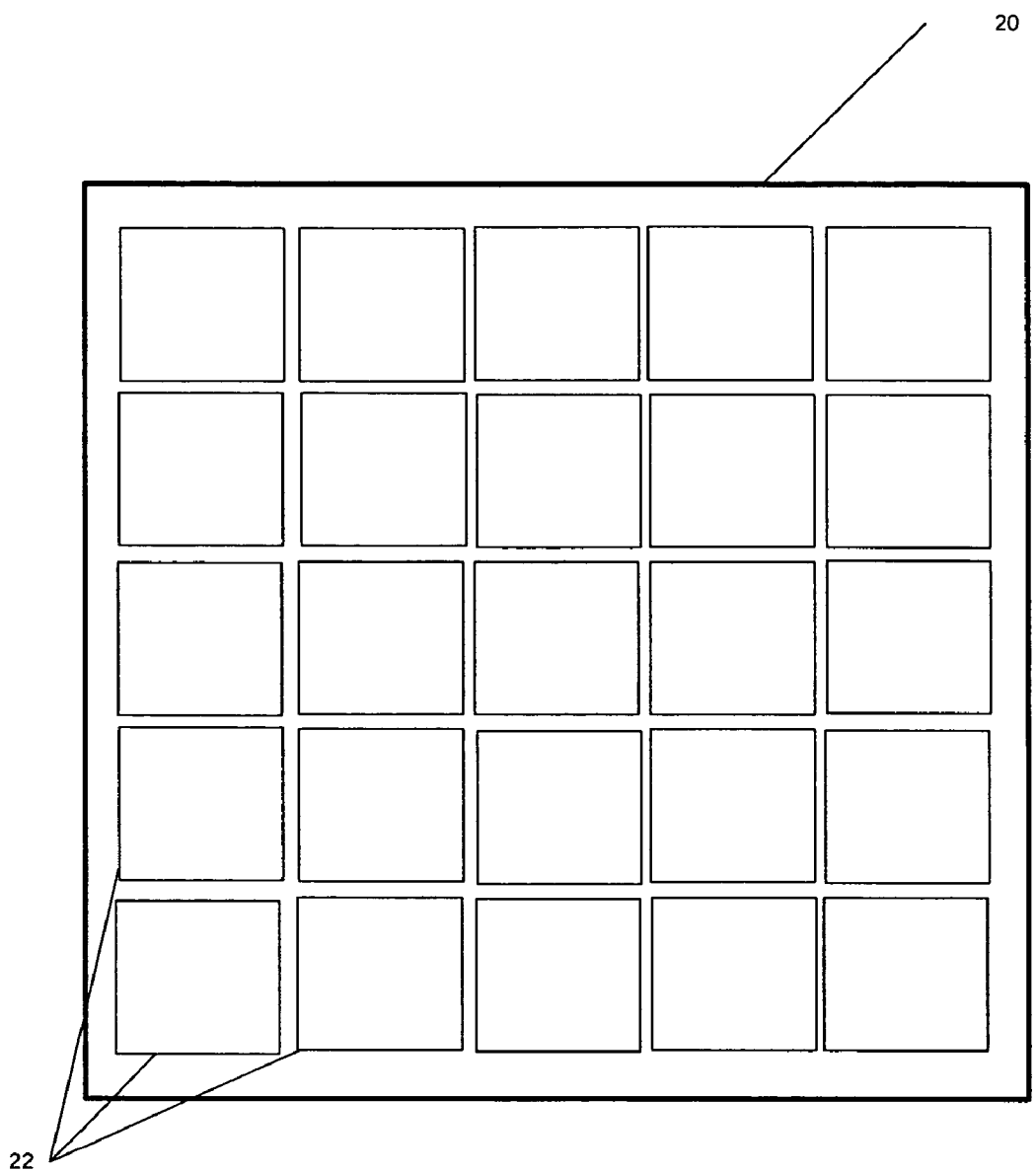
FIG. 2 is a plan view of a print field having multiple subfields.

FIG. 2 illustrates a print field 20 having multiple subfields 22. Typically, a print field is comprised of an integral number of subfields. Subfields 22 are shown a spaced distance from the perimeter of the print field 20 merely for clarification. Similarly, the subfields 22 are shown a spaced distance from one another merely for clarification. In an embodiment, subfields 22 may abut one another. Each subfield may accommodate one or more devices. The devices may or may not have similar geometries, features, and/or functions.

A first-layer geometry is created within each subfield 22. The first layer geometry includes first-layer features for one or more devices which may or may not be similar. The first layer features may have minimum feature sizes in the range of, for-example, 100 nm or smaller. Each first-layer geometry is arranged such that its features are arranged entirely within its respective subfield 22. In the embodiment shown, the first layer geometry has a centermost point which is substantially commensurate with the centermost point of the subfield. Thus, in an embodiment, each first-layer geometry is similarly arranged within its corresponding subfield. Such arrangement is in contrast to the second-layer geometries to be discussed below.

Figure 3:
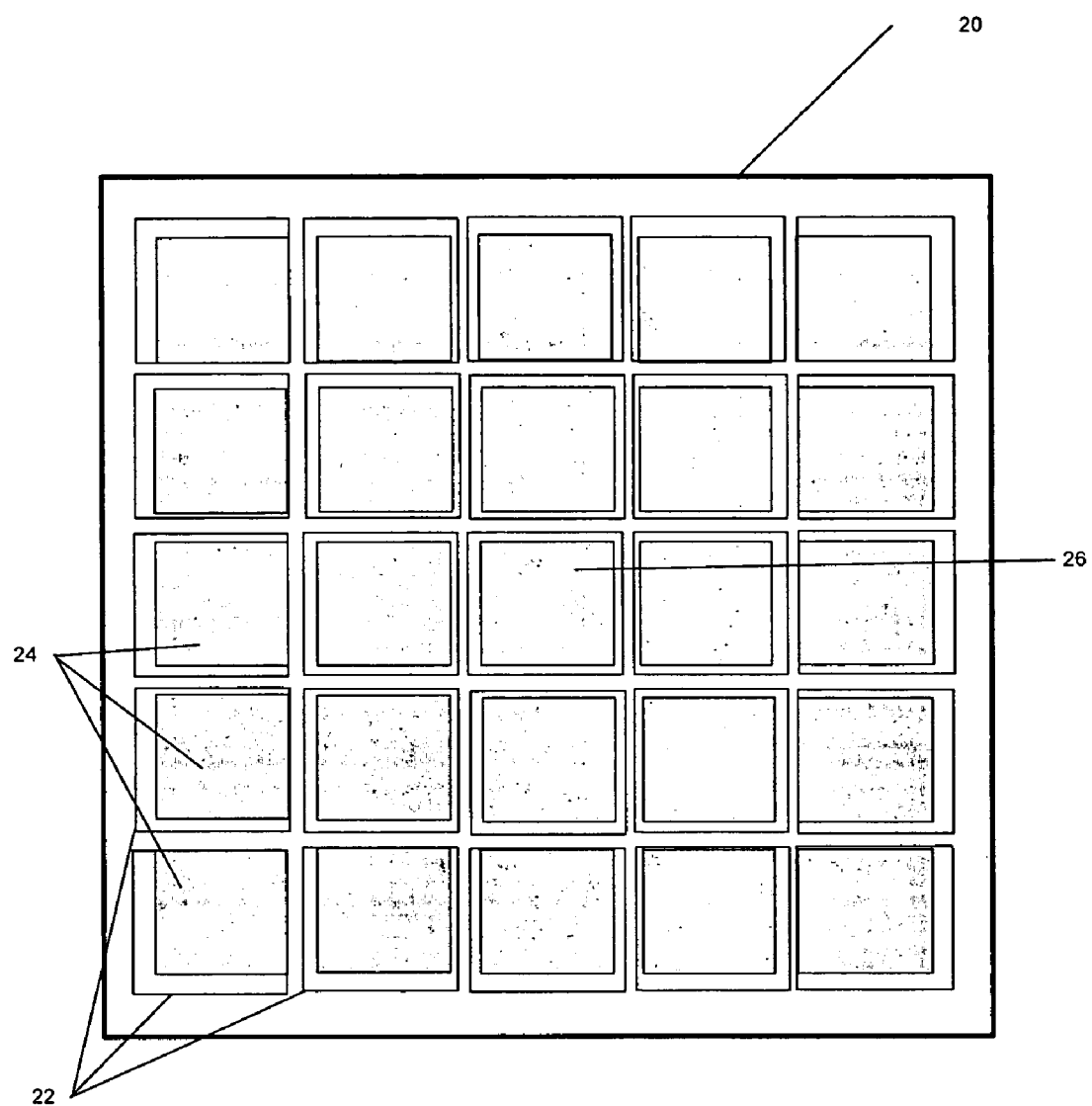
FIG. 3 is a plan view of a print field having first and second-layer geometries imprinted thereupon.

FIG. 3 illustrates the print field 20 having second-layer geometries 24 imprinted upon first-layer geometries. Each second-layer geometry is comprised of second-layer features, where at least one second-layer feature has a corresponding first-layer feature to which proper alignment is required for proper device operation. Typically, a second-layer geometry will occupy the same approximate area as its corresponding first-layer geometry. Therefore, it is noted that first-layer geometries do not necessarily extend to the perimeter of their respective subfields, as second-layer geometries may be printed entirely within their respective subfields. As used herein, first-layer or second-layer geometries may not necessarily include sacrificial diagnostic features. Such features may be created within the print field yet outside the subfields.

As shown, no two second-layer geometries are similarly arranged within their respective subfields. A centermost second-layer geometry 26 has a centermost point which is substantially commensurate with that of its respective subfield. However, each other second-layer geometry's centermost point is offset from that of its respective subfield. Further, each offset second-layer geometry has a unique offset. In an embodiment, each offset with respect to a centermost point of the subfield may be a multiple of about 25 nm. In this case, the offset multiple is therefore 25 nm. The offset multiple is a function of the capability of the lithography template-making process, system, and apparatus(es). Consequently, as template manufacturing improves, offset multiples may shrink accordingly.

Figure 4:
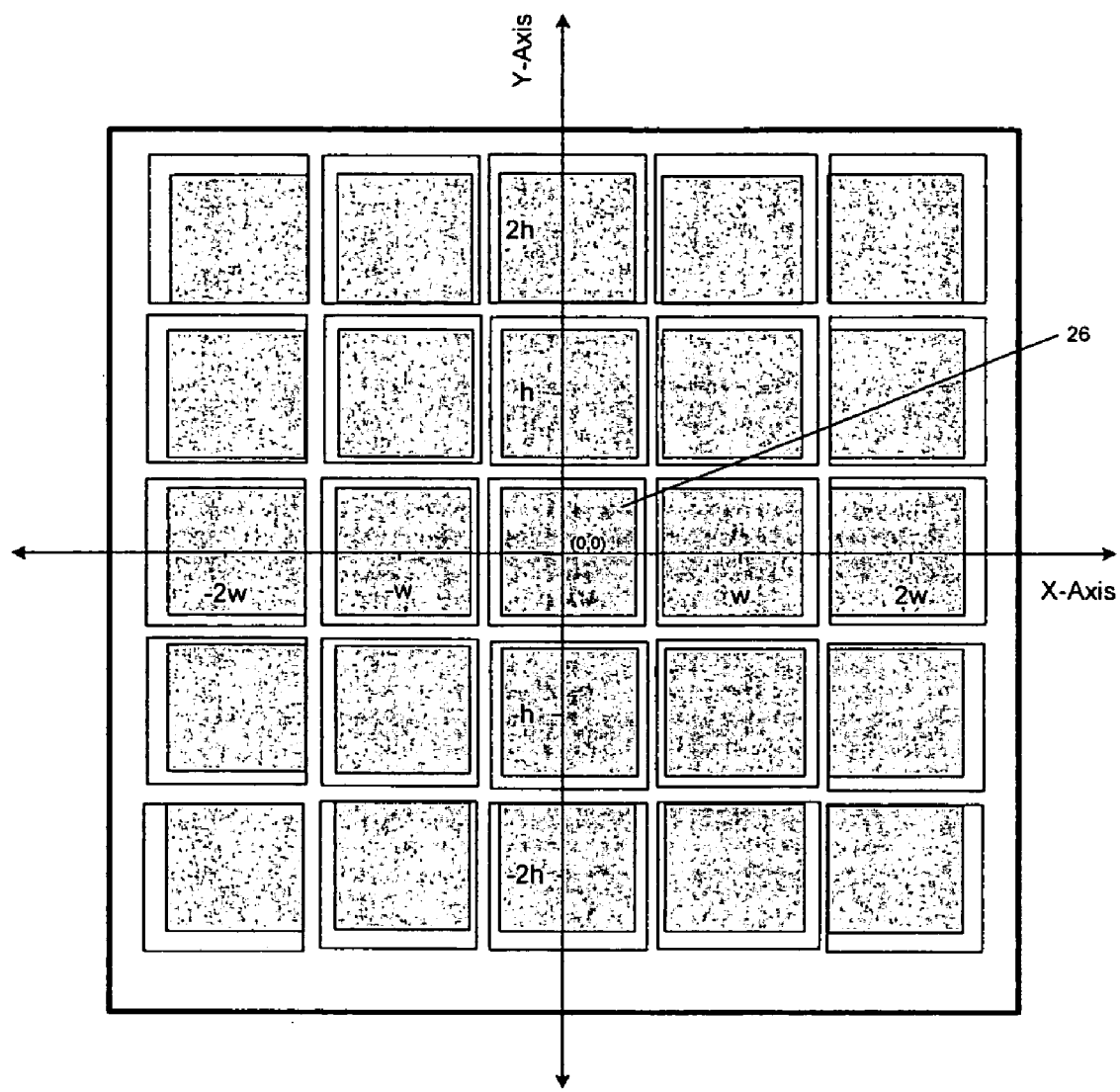
FIG. 4 is a plan view of the print field of FIG. 4 imposed upon x and y axes.

FIG. 4 illustrates the arrangement of the first-layer geometries and second-layer geometries with the aid of an (x,y) axis. Central second-layer geometry 26 is arranged such that its centermost point is substantially commensurate with the origin of the axis, (0,0). The subfields are arranged in an array having 'J' rows and 'K' columns. In this case, J=K=5. However, it is not required that J=K. Each column has a width 'w' and each row has a height 'h'. In this embodiment, the first-layer geometries are spaced commensurate with the subfields. Thus, the first layer geometries are not offset with respect to their respective subfields. Therefore, a center of any first-layer geometry is a horizontal distance of 'w' or a vertical distance of 'h' from any immediately laterally adjacent first-layer geometry. In the embodiment shown, 'w' equals 'h', and the centers of the first-layer geometries are equally spaced one from the next.

Figure 5:
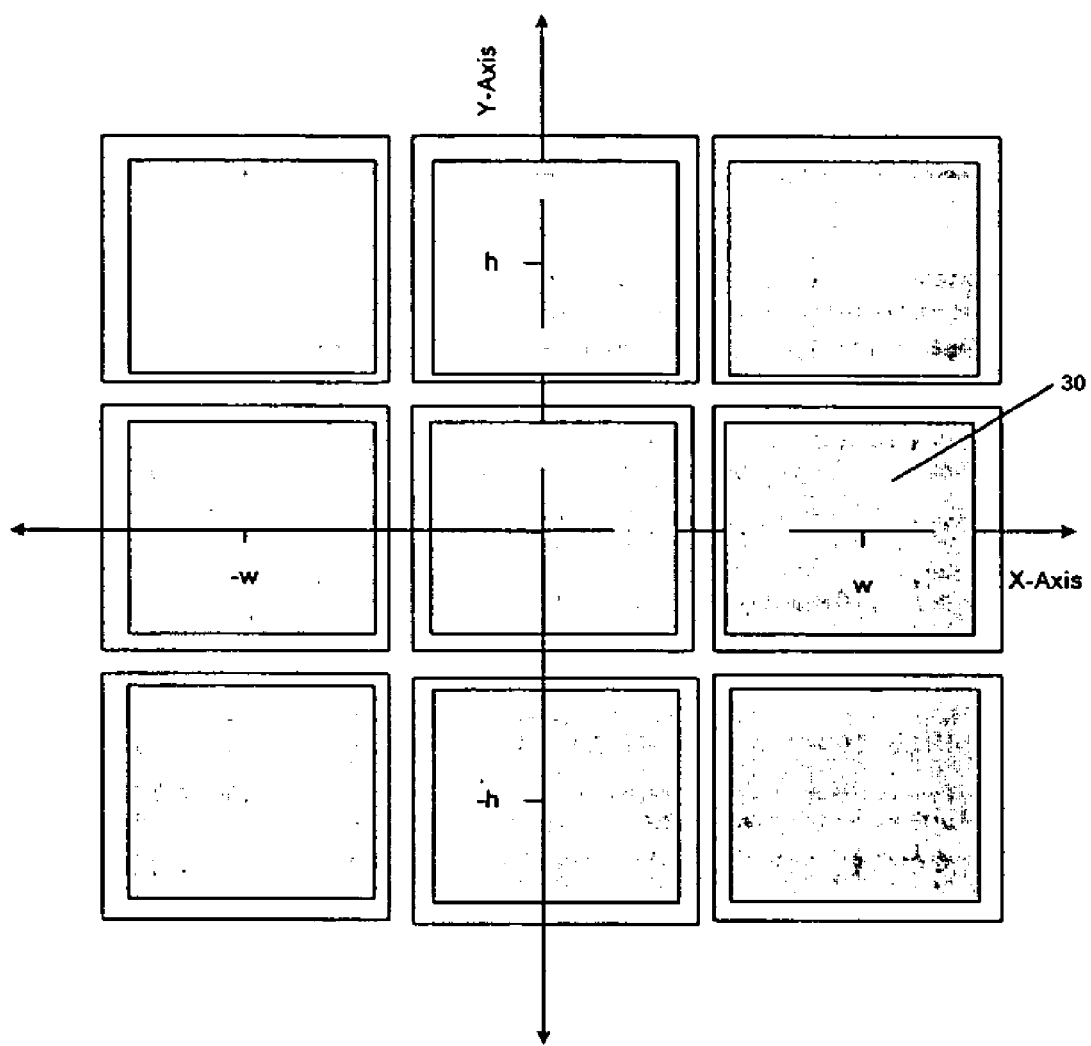
FIG. 5 is a more detailed view of FIG. 5.

As more clearly illustrated by FIG. 5, the centers of the second-layer geometries are also equally spaced. However, the spacing of the second-layer geometries are not equal to the spacing of the first-layer geometries. The columns of the second-layer geometries have a width 'w+Δw', and the rows have a height 'h+Δh'. It is noted that the offset multiples, Δw and Δh, may be any non-zero number. For example, the offset multiples shown in FIG. 5 are negative. In an embodiment, a centermost subfield is imprinted with geometries having no offset with respect to the centermost subfield, and geometries imprinted on remaining subfields have (x,y) offsets equivalent to the product of the respective offset multiples, (Δw,Δh), and the number of rows and columns from the centermost subfield. As an example, second-layer geometry 30 is one column, zero rows from the centermost subfield. Hence, the offset of second-layer geometry 30 is (Δw, 0).

While preferred embodiments of the instant invention have been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. As described above, a single wafer substrate is contemplated. However, it is recognized that the invention herein described may be employed with any number of lithography applications.

Additionally, although the designations first-layer and second-layer are used, it is understood that the terminology is not intended to be limiting. That is, although in an embodiment the first-layer may precede the second-layer, the first-layer does not necessarily immediately precede the second layer. Further, in an embodiment, the described second-layer having at least one offset second-layer geometry may actually precede the first-layer geometry having no offset geometries. That is, a layer having offsets with respect to the subfields may be printed prior to a layer having no such offsets. Further, both layers may have offsets. That is, there may be no layer having no offset geometries with respect to the respective subfields. Furthermore, the instant invention is not limited to 2 layers. Three or more layers may be employed without deviating from the intents and purposes of the instant invention. Consequently, a subfield may itself be comprised of subfields, or sub-subfields. Such sub-subfields may or may not comprise entire devices.

Further, the number of subfields which comprise a print field may not be constant, even within a single wafer. Maximum print field size is lithography system dependent. Therefore, the print field size may vary within a single wafer in those cases where processing is performed by multiple lithographic systems, each having a distinct print field size. Thus, the print field size may vary from one processing layer to another. Each print field may be comprised of multiple subfields, where each subfield accommodates one or more devices, and each subfield may be comprised multiple sub-subfields which may or may not accommodate whole devices and which may or may not include offset geometries.

However, whole print fields typically have an integral number of devices. Yet, partial print fields may be imprinted or patterned by the lithography system, particularly around a perimeter of the substrate. It is possible for a partial print field to produce yielding devices in those instances where a print field accommodates multiple devices. In the instances where a print field accommodates only a single device, partial print fields may also be imaged or patterned although no possibility of a yielding device exists. For example, such wafer edge processing may be advantageous in terms of, for example, layer uniformity and wafer planarity.

Although improving alignment registration for features less than about 100 nm has been described, it should be appreciated that the invention herein described is also suitable for improving alignment registration for any size features as may be required in the fabrication of, for example, an integrated circuit. Thus, as patterning resolution improves, the methods, systems, and templates described herein may continue to aid in improve lithographic alignment. Further, applications for the instant invention may exist in the manufacture of devices having features much larger than about 100 nm.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A method of improving alignment between subsequent imprinted device layers within a subfield to provide at least one functional device within the subfield, the method comprising steps of:
   a) establishing an x,y grid such that a centermost point of a subfield arranged within a central region has (x,y) coordinates (0,0);
   b) establishing an array comprising N subfields arranged in J rows and K columns, wherein each column has a width 'w', and wherein each row has a height 'h', and wherein a device is arranged entirely within a single subfield;
   c) imprinting a first layer of polymerizable material using a first lithographic template to form at least one feature, wherein the first layer comprises an array of N first-layer geometries, wherein a centermost point of a central first-layer geometry has (x,y) coordinates (0,0), wherein a centermost point of each first-layer geometry is commensurate with a centermost point of its respective subfield, and each centermost point of a first-layer geometry is a spaced distance 'w' from a centermost point of an immediately laterally adjacent first-layer geometry, and wherein a each centermost point of a first-layer geometry is a spaced distance 'h' from a centermost point of an immediately vertically adjacent first-layer geometry; and
   d) imprinting a second successive layer of polymerizable material using a second lithographic template to form at least one feature, where the second layer comprises an array of N second-layer geometries, wherein each second-layer geometry has a corresponding first-layer geometry, wherein a centermost point of a central second-layer geometry has (x,y) coordinates (0,0), wherein each centermost point of a second-layer geometry is a spaced distance 'w+Δw' from a centermost point of an immediately laterally adjacent second-layer geometry, and wherein each centermost point of a second-layer geometry is a spaced distance 'h +Δh' from a centermost point of an immediately vertically adjacent first-layer geometry, wherein Δw is not equal to zero, and wherein Δh is not equal to zero.

2. The method as recited in claim 1, wherein Δh equals Δw.

3. The method as recited in claim 1, wherein 'h' equals 'w'.

* * * * *